COMPRESSOR-LIMITER CIRCUIT

Filed July 28, 1969 2 Sheets-Sheet 1

INVENTORS
ROBERT A. PONTO
WILLIAM G. DILLEY Jr.
BY David V. Trask
ATTORNEY

INVENTORS
ROBERT A. PONTO
WILLIAM G. DILLEY Jr

BY David V. Trask

ATTORNEY 3,550,028

COMPRESSOR-LIMITER CIRCUIT

William G. Dilley, Jr., Ogden, and Robert A. Ponto, Clearfield, Utah, assignors to Spectra Sonics, Ogden, Utah, a proprietorship of Utah Filed July 28, 1969, Ser. No. 845,145
Int. Cl. H03g 3/30
U.S. Cl. 330—29 17 Claims

ABSTRACT OF THE DISCLOSURE

A dual-purpose electronic circuit which functions as both a compressor circuit and a limiter circuit is constructed (preferably entirely of solid state components) by interconnecting a signal-input means (preferably an input amplifier) and a signal-output means (preferably an output amplifier) through a gain-control system. The gain-control system includes attenuating means responsive to the intensity of an output signal compared with a reference voltage, threshold-control means for maintaining such a reference voltage, and slope-control means for selectively establishing a ratio of input signal gain to output signal gain. In its preferred form, the threshold-control means includes a control amplifier and a feedback amplifier. The preferred control amplifier includes novel driver and full-wave rectifier circuits. The preferred input and output amplifiers include feedback resistances in the collector circuits of their output stages. The preferred input amplifier also includes a combined voltage-dividing and biasing network of high impedance and a terminating load resistor connected through a combination filtering and coupling capacitor.

BACKGROUND OF THE INVENTION

Field

This invention relates to electronic circuits and provides a novel circuit with both compressor and limiter functions. Specifically, this invention provides a combination compressor and limiter circuit particularly suitable for use in audio systems.

State of the art

High-quality audio systems require special circuits to control the gain of the system so that its output remains relatively constant in spite of wide variations in the energy level of program material introduced to the system. Two separate circuits, designated in the art as compressors and limiters, respectively, are conventionally used to provide two necessary and distinct gain-control functions. Compressor circuits adjust the gain of the system so that a given amplitude range in the input program material effects a smaller amplitude range in the output. Limiter circuits block high-energy transients to prevent overloading of associated audio devices, such as tape recorders or transmitters.

Many types of compressor circuits are available but they are uniformly slow in response. Because their purpose is basically to adjust the gain of an audio system so that its output remains relatively constant, they function in response to the average level of the programmed material. They respond well to low frequencies, which have relatively more power, but allow high frequencies, which have relatively little power, to pass with little effect. There results a high-frequency boost which requires attenuation. The "compressed" signal is conventionally attenuated with a "de-emphasis network." The de-emphasis network attenuates all high frequencies without discrimination, thereby resulting in poor frequency response.

The slow speed of the compressor circuit allows high-frequency transients to pass unattenuated. These transient peaks must be eliminated in some fashion because of their tendency to overload equipment, such as tape recorders or transmitters, to which they are introduced. The aforementioned limiter circuit is thus used to remove these peaks from the system. An undesirable feature of limiter circuits is that they remove high-amplitudes without discrimination so that if the amplitude of desirable program material exceeds the pre-established limit of the limiter circuit, the peaks of the program frequencies are clipped, thereby causing large amounts of distortion.

For high-quality audio systems, both the compressor and limiter functions are essential. Combinations of available circuits for these functions, however, suffer from severe limitations in capability, including high distortion, low speed, poor frequency response, and high noise; and limited flexibility in application, due to their initial high cost and large size. These circuits are in effect the limiting factor in the quality of audio systems. Moreover, because of the necessity for multiple use capability of high-cost equipment, compressors and limiters have traditionally been constructed as separate units, including expensive ancillary circuits, such as amplifier and attenuator circuits, thereby duplicating components already in much of the equipment with which these circuits are traditionally used.

SUMMARY OF THE INVENTION

The present invention provides an electronic circuit with both compressor and limiter functions. The entire circuit may be of solid state construction so that it is conveniently assembled in modular, plug-in form. The resulting modual is sufficiently small for incorporation as an integral part in audio equipment. For this reason, the duplication of amplifier and attenuator circuits required for external compressors and limiters is unnecessary. Because of their small size and substantially reduced cost, it is practical to use a plurality of the circuits of the present invention with separate input devices, such as microphones, thereby providing for additional flexibility of useage not economically justified with the devices of the prior art.

The invention includes signal-input means, signal-output means, attenuating means, threshold-control means, and slope-control means; all interconnected in a novel arrangement to provide remarkable slope-control characteristics. In its preferred form, the input means is a novel amplifier circuit arranged to isolate input signals from the subsequent attenuating means and to permit adjusment of the signal level to minimize noise and distortion in an output signal. The preferred output means includes a similar amplifier circuit constructed and arranged to match the impedance of the load circuit. The attenuating means desirably includes a resistance network of variable impedance dependent upon the intensity of the output from the output means compared to a preselected, constant threshold reference voltage; it is arranged to operate upon and attenuate the signal output from the input-signal means before it is applied to the input of the signal-output amplifier. The threshold-control means desirably includes a control amplifier and a feedback amplifier arranged in circuit such that the feedback amplifier receives as input an attenuated program input signal (attenuated output signal from the input means) regulated by the control amplifier, and the control amplifier receives, as feedback input, a decoupled output from the feedback amplifier and, as negative feedback input, a fraction of the output signal from the output means. The slope-control means may be a resistive element connected between the output means and the threshold-control means and may be set at any predetermined level to selectively establish a ratio of input signal gain to output signal gain.

According to the present invention, the double processing which is conventionally effected in sequentially-arranged compressor and limiter circuits is replaced by a one-stage, simultaneous, processing operation. The overall performance characteristics of the claimed circuit is thus substantially improved compared to the overall performance characteristic possible with the prior art circuitry. Simultaneous compressing and limiting is accomplished by the claimed invention by unique driver circuitry embodied in the control amplifier. The control amplifier also eliminates the need for the de-emphasis network of the prior art. The present invention is characterized by a flat frequency response, independent of the characteristics of the program input; moreover, the distortion experienced by the prior art is substantially reduced. The novel driver circuitry of the control amplifier is a significant aspect of the present invention and has wide application other than the specific compressor-limiter circuit claimed hereby.

The unique circuit arrangement of the invention permits adjustment of the slope-control element so that the overall circuit may be operated as a fixed-output compressor or limiter. Moreover, the slope control of the invention can be adjusted to any desired level from this fixed output characteristic up to a linear amplifier. These capabilities have not heretofore been available in compressor circuits; the fixed output capability has rarely been available in even limiter circuits.

Although it is recognized that the compression and limiting functions of the claimed circuitry have application in a variety of electronic systems other than audio systems, the invention will be described with principal reference to audio systems. Specific sub-circuits, notably the driver and full-wave rectifier circuits of the control amplifier are themselves novel and constitute important advances in the art having many special purpose applications remote from the specific embodiment illustrated by the accompanying drawings.

DESCRIPTION OF THE DRAWINGS

In the drawings, which illustrate what is presently regarded as the best mode for practicing the invention.

Practical components and values are indicated in parentheses. Terminals in common in the several figures are correspondingly marked.

DESCRIPTION OF THE ILLUSTRATED EMBODIMENTS

Figure 1:
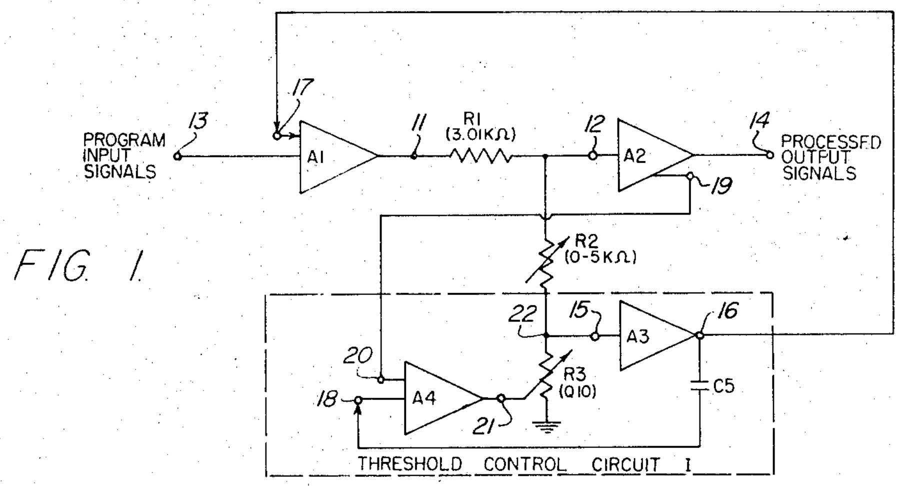
FIG. 1 is a block diagram illustrating the arrangement of the several circuit components of one specific embodiment of the invention, a special threshold-control circuit I being enclosed by broken lines.

As illustrated by FIG. 1, the output 11 of a signal-input amplifier A1 is connected through an attenuating resistor R1 to the input 12 of a signal-output amplifier A2. The program input signal of interest is applied to one input 13 of the input amplifier A1, whereas the processed output signal of interest is taken from an output 14 of the output amplifier A2. The attenuated input signal (applied to input 12) is also applied through a slope-control resistor R2 to an input 15 of a feedback amplifier A3. Feedback from an output 16 of the feedback amplifier A3 is applied directly to an input 17 of the input amplifier A1 and, in decoupled form, to an input 18 of a control amplifier A4. Negative feedback is applied from output 19 of the output amplifier A2 to an input 20 of the control amplifier A4. The output 21 of the control amplifier A4 is connected to a resistive control element R3 arranged to maintain a constant threshold reference voltage at the connection point 22 between the resistances R2 and R3.

FIGS. 2 through 5 each illustrate a preferred embodiment of the special purpose amplifiers designated A1, A2, A3, and A4, respectively, in FIG. 1. Each circuit may be powered by any convenient DC power supply, e.g., at about 24 volts. The illustrated specific circuits connected as shown by FIG. 1 result in a highly flexible, wide-band, low-distortion, low-noise amplifier with automatic gain control characterized by a slope control capable of adjusting the system's gain characteristics between those of a linear amplifier and a fixed output signal. Those skilled in the art will recognize that substantial modifications can be made to the specific circuits illustrated by FIGS. 2 through 5 while preserving many of the advantages resulting from the system configuration of FIG. 1. Many such modifications may be made for specific applications in instances where it is acceptable to sacrifice some aspects of the overall flexibility provided by the illustrated embodiment. For example, in some instances, the input amplifier A1 may be dispensed with and the input means may consist merely of a wire conductor, with or without other components, such as resistance elements. It is also possible to replace the output amplifier A2 with other impedance-matching devices for coupling the invention into specific load circuits.

Figure 2:
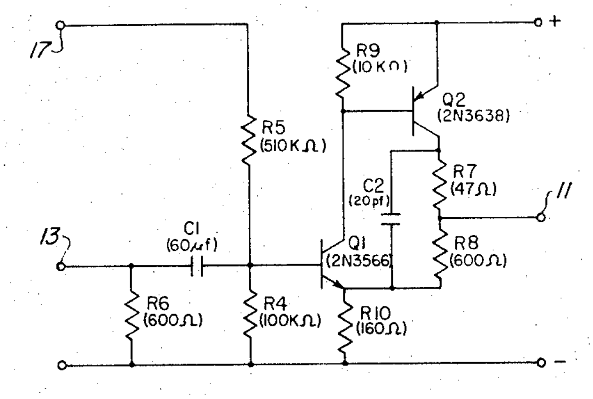
FIG. 2, a circuit diagram illustrating details of a preferred input amplifier.
Figure 3:
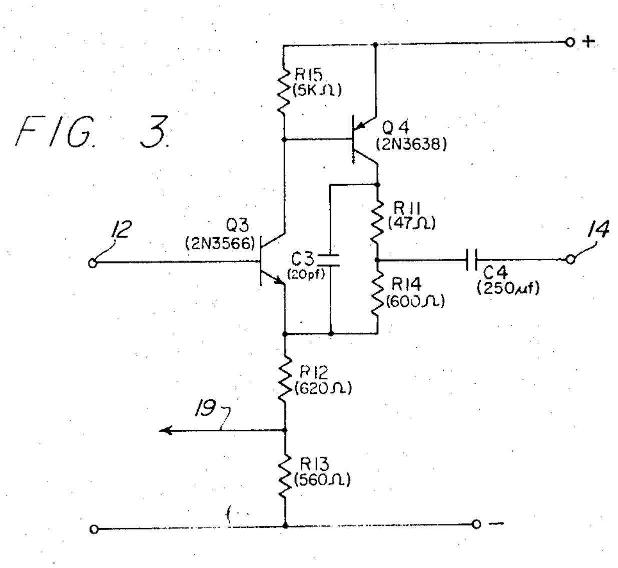
FIG. 3, a circuit diagram illustrating details of a preferred output amplifier.

Although the details of construction of the input-signal amplifier A1 and output-signal amplifier A2 illustrated by FIGS. 2 and 3, respectively, are important for many applications, the loop circuit I (threshold-control circuit) enclosed by broken lines in FIG. 1 is an important advance in the art when connected in the illustrated manner to input means and output means of other types. The slope-control means R2 is desirably variable as illustrated, but it may be a fixed resistance, interchangeable for particular applications; it may also comprise an external resistive element, if desired. The important aspect of the slope-control means from the standpoint of this invention is its circuit relationship to the other components.

The input amplifier illustrated by FIG. 2 provides isolation between the input and attenuating, or gain control, circuitry (R1, R2, and R3). It also provides amplification to adjust the level of the program input signals at point 11 to the appropriate level for proper gain control; i.e., to minimize noise and distortion in the processed output signals. Of course, the original program input signal may be reduced in intensity prior to its application to the input 13 of the input amplifier (A1, FIG. 1) by an external potentiometer (not shown) or other device, if desired. The illustrated amplifier circuit is a conventional, two-stage, transistor amplifier, modified to make it compatible with a low-distortion, wide-band system. Although other similar transistor amplifiers with an even number of additional stages may be employed, the two-stage amplifier illustrated is preferred from the standpoint of cost and is adequate in performance.

A combined biasing and filtering circuit comprised of the capacitor C1 and resistors R4 and R5 are connected as illustrated to the base circuit of the input stage Q1 of the input amplifier. The input impedance of the amplifier circuit is determined solely by the terminal resistor R6. This resistor may be changed as required to match source impedances without affecting the operation of the amplifier. The values of resistors R4 and R5 are much greater than that of R6 so that the input-decoupling capacitor C1 also acts as a low-pass filter for the feedback signal applied at the input terminal 17.

Another important feature of the input amplifier is the inclusion of resistance R7, as illustrated, to form, together with the feedback capacitor C2, a feedback path in the collector circuit of the output stage Q2. This circuit arrangement permits high-frequency feedback to the emitter of the input stage Q1 regardless of the loading on the output 11 of the input amplifier. Thus, the input amplifier may be terminated with a resistive, capacitive or inductive load with no effect on its high-frequency stability. The circuit is completed with resistors R8, R9, and R10 in conventional arrangement.

The output amplifier illustrated by FIG. 3 is a two-transistor amplifier of the same general type as the input amplifier illustrated by FIG. 2. It has an input stage Q3 and an output stage Q4. The resistor R11 and capacitor C3 comprise a high-frequency feedback path similar to that comprised of the resistor R7 and capacitor C2 of the input amplifier (FIG. 2). The combination filtering and biasing network described in connection with the input amplifier is not required for the output amplifier, but the voltage-dividing network consisting of R12 and R13 (replacing the conventional emitter resistor, such as R10 of FIG. 2) represents a significant design feature of the output amplifier circuit. This network provides a combination AC and DC feedback source 19 at a predetermined fraction of the output signal, without loading either the input 12 or output 14 and while maintaining a low source impedance. The resistors R14 and R15 are conventional and correspond to the resistors R8 and R9 of the input amplifier (FIG. 2). A coupling capacitor C4 is provided in conventional arrangement.

The feedback amplifier illustrated by FIG. 4 is again similar to those illustrated by FIGS. 2 and 3. Although both the input and output amplifiers may have more than two stages, provided they contain an even number of stages, the feedback amplifier should be a two-stage amplifier with an input stage Q5 and an output stage Q6 substantially as illustrated. The resistor R16 is conventional and corresponds to the resistors R9 (FIG. 2) and R15 (FIG. 3). The remainder of the resistors R17 through R20 and the Zener diode Z1 are carefully balanced to provide a number of circuit functions with a minimum of components. These circuit functions could be provided by more elaborate circuitry, involving the inclusion of additional, less carefully balanced components. The illustrated circuit arrangement is economical, both from the standpoint of cost and from the standpoint of space requirements, and is thus preferred.

As illustrated, the feedback amplifier includes a two-stage transistor amplifier with the emitter of the input stage Q5 biased from a divided network consisting of resistors R17 and R18 across a reference voltage source Z1. Although the preferred reference voltage source is an avalanche effect solid state device, such as the Zener diode Z1 illlustrated, other sources, such as a battery, could be used if desired. The AC output 16 of the feedback amplifier is applied directly to the input 17 of the input amplifier (A1, FIG. 1); it is applied through a capacitor C5 to the input 18 of the control amplifier (A4, FIG. 1). The AC gain of the feedback amplifier circuit determines the threshold reference voltage (the voltage at the connection point 22 of FIG. 1) while the DC gain of the feedback amplifier determines the bias level of the overall circuit illustrated by FIG. 1. The DC power input is divided across the resistor R20 and the Zener diode Z1 to provide a reference voltage 23 for the control amplifier illustrated by FIG. 5.

Figure 5:
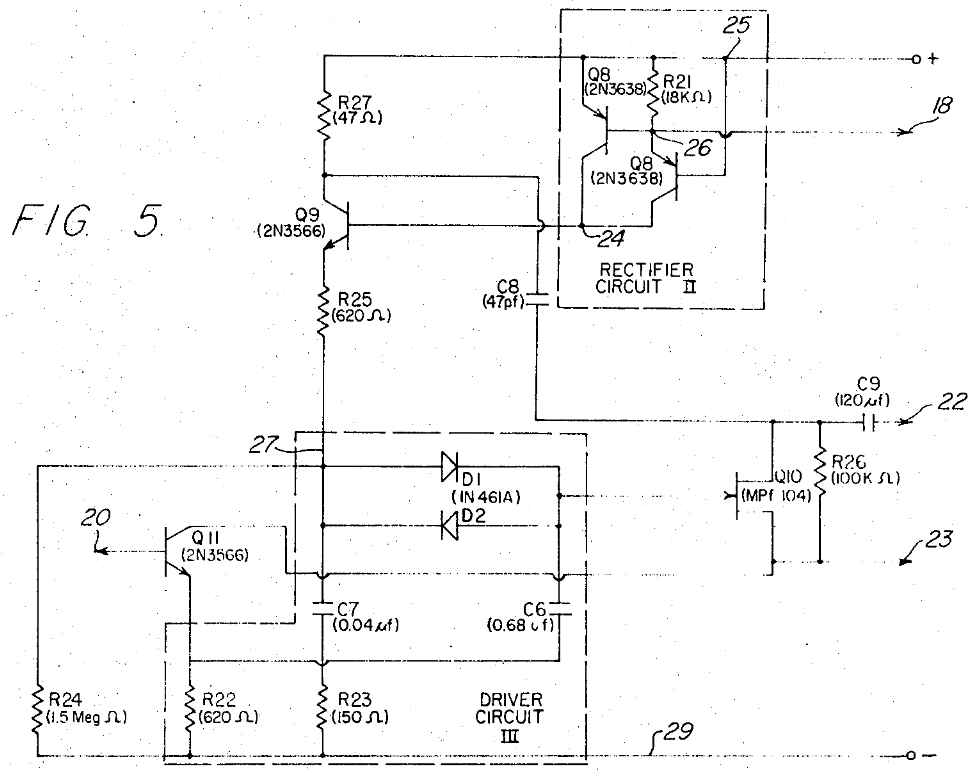
FIG. 5, a circuit diagram illustrating details of a preferred control amplifier, special full-wave rectifier II and driver III circuits being enclosed by broken lines.

The control amplifier illustrated by FIG. 5 provides the simultaneous limiting and compression functions of the overall circuit. It includes novel full-wave rectifier II and driver III circuits, enclosed by broken lines. The system's low distortion, high-speed reaction time, wide range of release times and low noise characteristics are determined by this special circuit.

Figure 4:
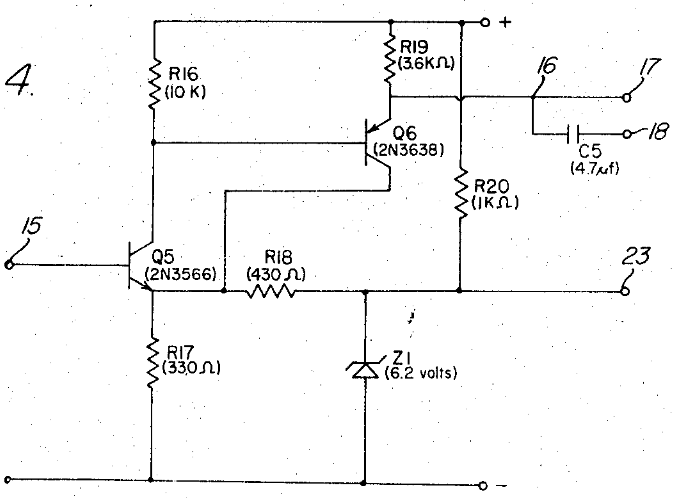
FIG. 4, a circuit diagram illustrating details of a preferred feedback amplifier.

The rectifier II of the control amplifier comprises two similar transistors Q7 and Q8 connected with their collectors tied together to form an output 24 and with the base of each tied to the emitter of the other in a pair of base-emitter connection points 25 and 26, respectively. Thus, AC signals applied across these base-emitter connection points 25 and 26, are full-wave rectified with voltage gain. The threshold voltage at the connection point 22 is determined by the base-to-emitter voltages of the transistors Q7 and Q8. These voltages are determined by the values of the resistors R17, R18, R19, and R20 (FIG. 4). A bleeder resistor R21 is connected as shown to ensure that no DC voltage appears on the applied signal 18.

The pulsating DC output from the rectifier circuit is applied to the base of a transistor Q9, which functions as an isolation amplifier, to drive the aforementioned novel driver circuit III indicated by broken lines. Input to the driver circuit III is through a conductor 27 and output from the driver circuit is through a conductor 28. Input return for the driver is through a conductor 29. The specific driver circuit illustrated includes a pair of capacitors C6 and C7 connected in parallel between the input conductor 27 and input-return conductor 29. These capacitors are isolated on their input sides by a pair of diodes D1 and D2 connected in opposite polarity and in parallel. They are also isolated on their input-return sides by resistance comprised of the resistors R22 and R23, respectively. The input conductor 27 and the input-return conductor 29 are also connected through a resistor R24. The resistor R25 protects the transistor Q9 from excessive current; it also determines, together with the sum of capacitors C6 and C7, the attack time of the "compressor" circuit function.

Output 28 from the driver circuit is applied to the gate of a field effect transistor (FET) Q10. The FET Q10 corresponds to the resistive control element R3 of FIG. 1. The reference voltage 23 developed by the feedback amplifier, as aforedescribed, is applied to one leg of the FET Q10 to bias it above the potential carried by the input-return conductor 29; it is also applied to the collector of a transistor Q11 connected to isolate the feedback input 20 from the output 19 of the output amplifier (A2, FIG. 1). A bleeder resistor 26 is connected between the two legs of the FET transistor Q10 to prevent the development of a potential difference between the legs, thereby assuring that the control element R3 (Q10) contributes no noise to the system.

Application of the reference potential 23 to the transistor Q11 permits this transistor Q11 to be operated at a much higher current level than its power dissipation would permit if it were supplied from the normal power input. Thus, the resistor R22 may be of low value, thereby permitting a low impedance to drive the capacitor C6. The capacitor C6 drives the gate of FET Q10 with an AC signal proportional to the feedback signal 20. This signal corresponds to the output 18 of the output amplifier (A2, FIG. 1) which also has a low source impedance. The low source impedance from the transistor Q11 insures that the gate of the FET Q10 is not modulated by switching transients generated by the control amplifier. Such modulation would modulate the output signal 14 by modulating the effective resistance contributed by the FET transistor Q10.

The transistor Q9 acts as a high frequency phase inverter to supply a feedback signal to one leg of the FET Q10 to compensate for phase shift at high frequency through the entire system. The feedback signal is derived across a resistor R27 and is applied through a capacitor C8. The capacitor C8 should be of sufficiently small value to be ineffective in the usable spectrum.

The threshold reference potential 22 is applied through a decoupling capacitor C9.

Figure 6:
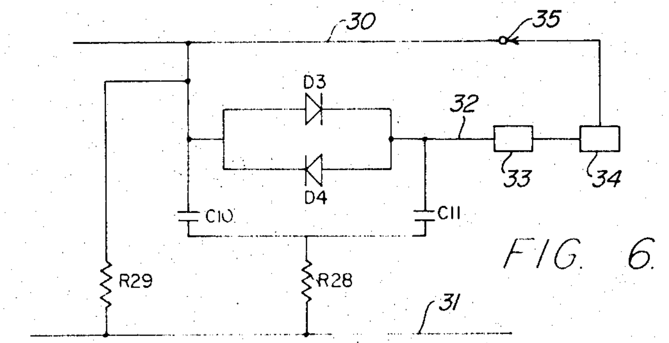
FIG. 6, a circuit diagram illustrating an alternative form of driver circuit.

As previously indicated, the driver circuit of the present invention has many applications; its operation will be explained with reference to the more general embodiment illustrated by FIG. 6. The driver circuit of FIG. 6 is interconnected between an input conductor 30, an input-return conductor 31, and an output conductor 32. A pair of capacitors C10 and C11 are connected in parallel between the input conductor 30 and the input-return conductor 31. The capacitors are isolated from the input-return conductor by resistance R28. (R28 thus replaces the resistors R22 and R23 of the driver circuit illustrated by FIG. 5.) The input conductor 30 and input-return conductors 31 are connected through a resistance R29. A pair of diodes D3 and D4 are connected in opposite polarity and in parallel to isolate the capacitors C10 and C11 on their input sides. Output 32 from the circuit is taken from the input side of one of the capactiors C11 after the diodes D3 and D4. The output 32 may be applied to a control element 33 which drives an external circuit 34 which in turn provides input 35 to the input conductor 30 of the driver circuit.

In operation, capacitor C10 stores rectified signals applied to it through the conductor 30. It then transfers its charge through the diodes D3 and D4 (depending upon polarity) to the capacitor C11. The charge on capacitor C11 drives the control element 33. (In the specific instance illustrated by FIG. 5, the DC rectified and filtered signal is applied to the gate of FET Q10 and controls its effective resistance.) The control element 33 establishes the signal 35 emitted by the external circuit 34. Referring to FIG. 5, the signal at 22 is controlled by the specific driver circuit illustrated. This signal constitutes the threshold reference level of the entire system illustrated by FIG. 1.

The arrangement of diodes D3 and D4, capacitors C10 and C11, and resistor R28 accounts for the low distortion, fast speed, broad release time, and combined compression and limiting capability of the invention. The filtered signal appearing on capacitor C10 has ripple which would cause distortion, but the diodes D3 and D4 isolate this ripple from capacitor C11. The diodes D3 and D4 pass high-amplitude fast singals so that high-speed transients are not lost. The resistor R28 isolates the capacitors C10 and C11 from the input-return conductor 31 so that these high speed transients can pass without charging the capacitors C10 and C11; the limiter function is thus separated from the compressor function of the driver circuit. If the time duration of a signal is such that the capacitors C10 and C11 do not charge, the release time of the circuit (discharge of C10 and C11) is instantaneous. On the other hand, if the time duration of a signal is sufficient for the capacitors to charge, they discharge according to the time constant determined by the resistor R29; this time constant can be adjusted within very broad limits. Resistor R28 can be of very small values while the values of R29, C10 and C11 can be relatively large so that the limiter function is characterized by a very fast recovery time while the compressor maintains a long release time. Practical values for such an arrangement are indicated by FIG. 5. Because the value of R24 is very large compared to the values of R22 and R23, more current is required from the transistor Q9 to drive the lower impedance of R22 and R23. Because R22 and R23 determine the limiting mode, the limiter is caused to attack at a higher level than the compressor.

We claim:

1. An electronic circuit with both compressor and limiter functions, comprising:

signal input means for receiving electronic input signals;

output means operably connected to said input means for delivering corresponding output signals in response to said input signals;

threshold control means operably associated with said output means for maintaining a selected reference voltage, including driver circuit means for controlling said reference voltage, said driver circuit means being connected to receive signals proportional to the output of the output means and the said reference voltage, respectively;

attenuating means operably connected to said input means, output means and threshold control means to attenuate input signals in response to the intensity of said corresponding output signals in comparison with said reference voltage; and slope control means interconnected between said output means and said threshold control means for selectively establishing a ratio of input signal gain to output signal gain.

2. A circuit according to claim 1, wherein said input means includes an amplifier circuit arranged to isolate said input signals from said attenuating means and to permit adjustment of the level of said input signals to minimize noise and distortion in said output signal.

3. A circuit according to claim 2, wherein the amplifier circuit is a transistor amplifier with an even number of stages with feedback resistance connected between the collector and the output terminal of its output stage and a feedback path connected from the collector side of said feedback resistor to the emitter of its input stage transistor such that high-frequency signals are fed back to its input stage without regard to loading on its output stage.

4. A circuit according to claim 3, including a combined biasing and filtering circuit connected to the base circuit of the input stage of said amplifier, said combination circuit including a voltage dividing biasing network of high impedance and a terminating load resistor connected to the biasing network through a capacitor so that the value of said terminating load resistor may be changed to match source impedances without affecting the operation of the amplifier.

5. A circuit according to claim 1, wherein said output means includes an amplifier circuit constructed and arranged to drive the impedance of the load circuit.

6. A circuit according to claim 5, wherein the amplifier circuit is a transistor amplifier with an even number of stages with feedback resistance connected between the collector and the output terminal of its output stage and a feedback path connected from the collector side of said feedback resistor to the emitter of its input stage transistor such that high-frequency signals are fed back to its input stage without regard to loading on its output stage.

7. A circuit according to claim 1, wherein the threshold control means includes a control amplifier and a decoupled feedback path connected between said reference voltage and said control amplifier to apply a potential directly proportional to said reference voltage to said control amplifier.

8. A circuit according to claim 7, wherein the threshold means includes a control amplifier and a feedback amplifier arranged in circuit such that the feedback amplifier receives an attenuated input signal regulated by the control amplifier and the control amplifier receives as feedback input a decoupled output from the feedback amplifier and as negative feedback input a fraction of the output signal from said output means.

9. A circuit according to claim 8, wherein the input means includes a transistor amplifier having an even number of stages with a combined biasing and filtering circuit connected to the base circuit of its input stage, said combination circuit including a voltage dividing biasing network of high impedance and a terminating load resistor connected to the biasing network through a capacitor so that the value of said terminating load resistor may be changed to match source impedances without affecting the operation of the amplifier; and said amplifier is connected to receive, as feedback input, a direct-coupled output from said feedback amplifier.

10. A circuit according to claim 9, wherein the feedback amplifier includes a two-stage transistor amplifier with the emitter of the input stage biased from a divided network across a reference voltage source, thereby permitting independent selection of AC and DC gains and outputs, the AC output being said decoupled feedback input to said control amplifier, the DC output being said direct coupled feedback input to said input amplifier, said AC gain determining said threshold reference voltage, and said DC gain determining the bias level of the overall circuit.

11. A circuit according to claim 10, wherein the output means includes an amplifier circuit constructed and arranged to drive the impedance of the load circuit, connected to deliver as negative feedback to said control amplifier a potential proportional to, but a fraction of, its output signal.

12. A circuit according to claim 11, wherein said input amplifier has feedback resistance included in the collector circuit of its output stage such that high-frequency signals are fed back to its input stage without regard to loading on its output stage.

13. Driver circuit for a control element arranged in a loop circuit such that the control element regulates the input to said driver circuit, comprising:

a pair of capacitors connected in parallel between an input conductor and an input-return conductor;
resistance connected to isolate said capacitors from said input return conductor;
resistance connecting said input conductor to said input-return conductor; and
a pair of diodes connected in opposite polarity and in parallel to isolate said capacitors on their input sides, the output from said driver circuit being taken from the input side of one of the capacitors after the diodes.

14. A driver circuit according to claim 13, connected with its output applied to the gate of a field effect transistor, said field effect transistor being connected to regulate an external circuit which provides input to said driver circuit.

15. A driver circuit according to claim 13, with said input conductor connected to receive input signals through a full wave rectifier from an external circuit regulated by said control element.

16. A driver circuit according to claim 15, wherein the full wave rectifier comprises a pair of similar transistors connected with their collectors tied together to form an output and with the base of each tied to the emitter of the other to form two base-emitter connection points, the input to said rectifier being applied between said base-emitter connection points.

17. A driver circuit according to claim 16, in combination with field effect transistor connected such that the output from said driver circuit is applied to its gate, one leg is biased above the potential carried by said input-return conductor, the other leg is connected to regulate said external circuit, and resistance is connected between said legs of sufficient impedance to prevent the development of a potential difference between said legs.

References Cited

UNITED STATES PATENTS

| | | | |
|---|---|---|---|
| 2,056,824 | 10/1936 | Cawley | 328—26X |
| 2,971,164 | 2/1961 | Saari | 330—145 |
| 3,391,249 | 7/1968 | Becker et al. | 328—135X |
| 3,435,360 | 3/1969 | Carroll | 330—28X |
| 3,441,748 | 4/1969 | Werner | 330—244X |

ROY LAKE, Primary Examiner

J. B. MULLINS, Assistant Examiner

U.S. Cl. X.R.

330—140, 145